United States Patent
Kitamura et al.

(10) Patent No.: US 7,598,461 B2
(45) Date of Patent: Oct. 6, 2009

(54) ELECTRONIC APPARATUS MOUNTABLE ON RACK

(75) Inventors: Yoshikuni Kitamura, Hamamatsu (JP); Ken Iwayama, Hamamatsu (JP)

(73) Assignee: Yamaha Corporation, Hamamatsu-Shi (JP)

( * ) Notice: Subject to any disclaimer, the term of this patent is extended or adjusted under 35 U.S.C. 154(b) by 0 days.

(21) Appl. No.: 12/176,327

(22) Filed: Jul. 18, 2008

(65) Prior Publication Data

US 2009/0020330 A1   Jan. 22, 2009

(30) Foreign Application Priority Data

Jul. 20, 2007   (JP) .............................. 2007-189814

(51) Int. Cl.
*H01R 13/46* (2006.01)
*H05K 5/00* (2006.01)

(52) U.S. Cl. ........................ 174/520; 361/730; 361/752; 361/796; 361/801

(58) Field of Classification Search ................. 174/520; 361/728, 752, 730, 796, 801
See application file for complete search history.

(56) References Cited

U.S. PATENT DOCUMENTS

| | | | |
|---|---|---|---|
| 6,522,551 B2 * | 2/2003 | Hsu et al. .................... | 361/752 |
| 6,625,035 B1 * | 9/2003 | Steinman et al. ............. | 361/759 |
| 6,839,237 B2 * | 1/2005 | Berry et al. .................. | 361/727 |
| 6,924,989 B2 * | 8/2005 | Hall ............................ | 361/826 |
| 7,453,707 B2 * | 11/2008 | Beall et al. ................... | 361/796 |

FOREIGN PATENT DOCUMENTS

JP   9-199879 A   7/1997

OTHER PUBLICATIONS

Operation Manual; "Power Amplifier XP7000/XP5000/XP3500/XP2500/XP1000"; Jun. 2007; Internet address: URL: http://www2.yamaha.co.jp/manual/pdf/pa/japan/amp/xp7000#ja.pdf; pp. 6 and 15.
Operation Manual; "Power Amplifier T5n/T4n/T3n Operation Manual"; Yamaha Corporation; Jun. 2007; Internet address: URL:http://www2.yamaha.co.jp/manual/pdf/pa/japan/amp/t5n#t4n#t3n#ja#om.pdf; pp. 6/18 and 16/18.

* cited by examiner

*Primary Examiner*—Hung V Ngo
(74) *Attorney, Agent, or Firm*—Rossi, Kimms & McDowell, LLP

(57) ABSTRACT

An electronic apparatus is mountable in either of a standard mount state in a rack, or an offset mount state which offsets forward from the standard mount state in a depth direction of the rack. A pair of side boards extend rearward from a front panel in the depth direction, and are spaced apart from each other at left and right sides in a width direction perpendicular to the depth direction. A pair of rack angles are attached to the pair of the side boards, respectively. The rack angle is composed of a first mounting plate and a second mounting plate intersecting perpendicularly to the first mounting plate. One of through-holes formed in the first mounting plate of the rack angle and screw holes formed in the side board is positioned in correspondence to both of the standard mount state and the offset mount state, so that the rack angle is selectively attached to the side board in either of the standard mount state and the offset mount state. The second mounting plate of the rack angle is attached to and superposed on an extended part of the front panel in the standard mount state, and otherwise the second mounting plate is spaced rearward in the depth direction apart from the extended part of the front panel in the offset mount state.

4 Claims, 5 Drawing Sheets

FIG.6 (a)
FIG.6 (b)
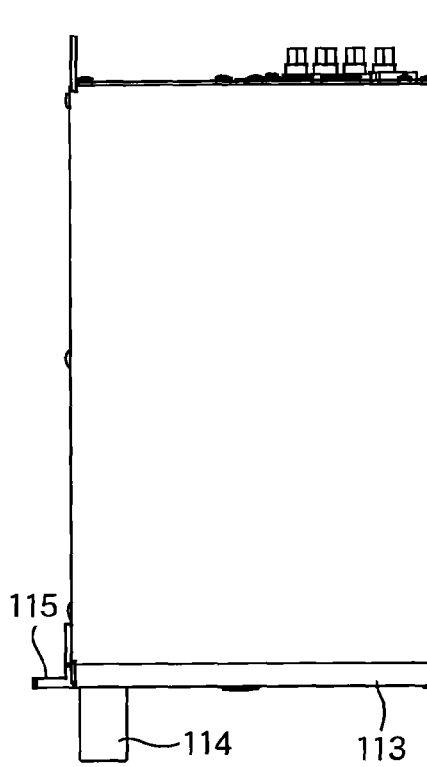
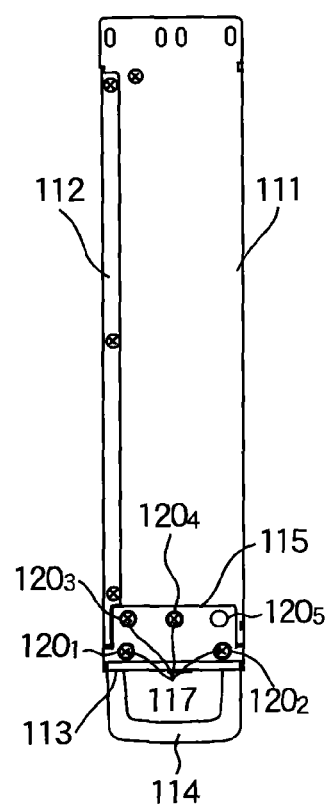
FIG.6 (c)
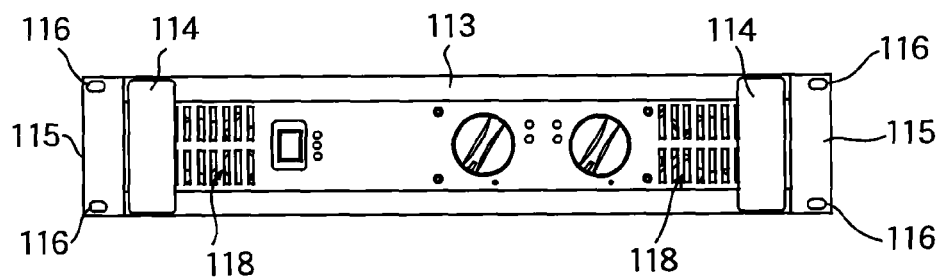
FIG.7
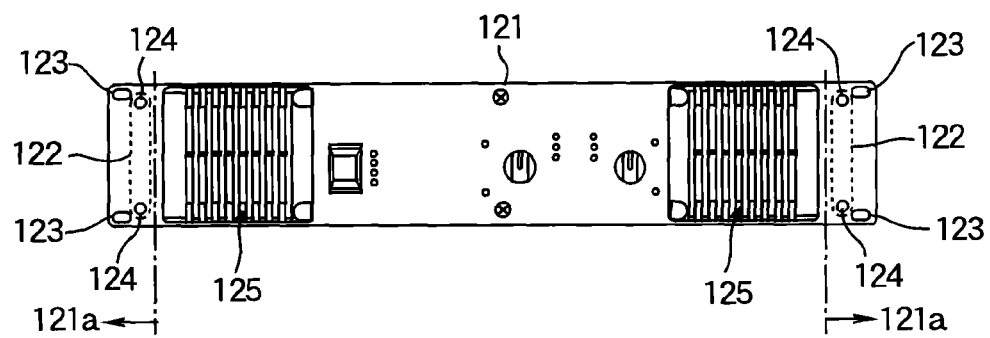

ELECTRONIC APPARATUS MOUNTABLE ON RACK

This application is based on, and claims priority to, Japanese Patent Application No: 2007-189814, filed on Jul. 20, 2007. The disclosure of the priority application, in its entirety, including the drawings, claims, and the specification thereof, is incorporated herein by reference.

BACKGROUND OF THE INVENTION

1. Technical Field

The present invention relates to an electronic apparatus mountable on a rack provided with structure of mounting the electronic apparatus. In particular, the present invention is suitable for a business-use audio power amplifier.

2. Background Art

Business-use audio power amplifier for PA (Public Address), SR (Sound Reinforcement), etc. is used at the per-manent' facilities such as a hall, a theater, and a banquet hall, or a moving venue, such as a live concert, and an event. In order that such business-use audio power amplifier may comply with requirement specifications, such as high power, high efficiency, and robustness, most have a weight over 10 kg and are provided with a cooling fan.

Such business-use audio power amplifiers are used by mounting on a rack, since two or more sets are used simultaneously in many cases. When using business-use audio power amplifier at a moving venue, the number of business-use audio power amplifier(s) according to the moving venue are mounted on a rack at the venue.

Generally, in an electronic apparatus mountable on a rack, attaching parts are provided in right and left of the front panel, and in addition carry handles may be provided (Refer to Patent Document 1).

FIG. 6 is an explanatory diagram showing a first conventional example (Refer to Non-patent Document 1) of a business-use audio power amplifier. FIG. 6(a) is a top view, FIG. 6(b) is a right side view, and FIG. 6(c) is a front view.

In FIG. 6, the reference numeral 111 denotes a side board of a main chassis, and the reference numeral 112 denotes a top cover, the reference numeral 113 denotes a front panel, the reference numeral 114 denotes a carry handle, the reference numeral 115 denotes a rack angle, the reference numeral 116 denotes a through-hole (long hole), the reference numeral 117 denotes a screw, the reference numeral 118 denotes a fresh air inlet, the reference numeral 119 denotes a back plate, and the reference numerals $120_1$ to $120_5$ denote through-holes. The through-holes $120_1$, $120_2$, and $120_4$ are holes for the usual attachment which does not pass through a head of a screw although an axial part of a screw is passed through. However, the through-holes $120_3$ and $120_5$ are escape holes which let the head of a screw pass.

The rack angles 115 are metal fittings of L type, and are attached to the front panel 113 in a form where the right and left are extended, by securing the three screws 117 to screw holes formed on he side board of the main chassis through the through-holes $120_1$, $120_2$, and $120_4$.

On the other hand, the screw 117 passed through to the through-hole $120_3$ (escape hole) of the rack angle 115 passes through a through-hole formed in the side board on the right-hand side of the main chassis, and is secured to a screw hole formed in the sub chassis inside a case. As a result, the side board on the right-hand side of the main chassis and the sub chassis are fastened with each other.

Although the illustrated through-hole $120_5$ (escape hole) is not used, the through-hole $120_5$ is used with the through-holes $120_1$, $120_2$, and $120_4$ when attaching the same rack angle 115 to the other side board on the left-hand side of the main chassis. That is, the side board on the left-hand side of the main chassis and the sub chassis are fastened by passing a screw which passed through the through-hole $120_5$ (escape hole) through a through-hole formed in the side board on the left-hand side of the main chassis, and securing the screw to the screw hole of the sub chassis.

A power amplifier is mounted on a rack by abutting the front of a support part of the rack which is not illustrated to a rear face of the rack angle 115 attached to the side board 111 of the main chassis, passing a screw which is not illustrated through the through-hole 116, and securing the screw to a screw hole formed in the support part (vertical rail) or a screw hole of a cage nut provided in this support part. The carry handle 114 is attached inside rather than the side board 111 of right and left of the main chassis.

In the first conventional example mentioned above, since the carry handle 114 is attached within the case of power amplifier, this carry handle 114 covers the fresh air inlet 118, and reduces cooling efficiency of the cooling fan. Furthermore, even when the carry handle 114 is unnecessary, there is a problem that a user cannot remove the carry handle 114 easily.

FIG. 7 is an explanatory diagram showing a second conventional example (Refer to the Non-patent Document 2) of a business-use audio power amplifier. Only a front view in the state where a carry handle 122 is not attached is shown.

In FIG. 7, the reference numeral 121 denotes a front panel, the reference numeral 121a denotes an extended part of the front panel, the reference numeral 122 denotes a carry handle (shown by a dashed line), the reference numeral 123 denotes a through-hole (long hole), the reference numeral 124 denotes a through-hole, and the reference numeral 125 denotes a fresh air inlet.

The back side of the extended part 121a of the front panel lies outward from a side board of right and left of the main chassis which is not illustrated. The audio power amplifier is mounted on a rack by passing a screw to the through-hole (long hole) 123 provided in the extended part 121a of the front panel, and securing the screw to a support part of the rack. Therefore, a rack angle is integrally formed with the front panel 121.

Since the carry handle 122 is attached in the extended part 121a of the front panel, attachment/detachment is free for the carry handle 122. Moreover, since the carry handle 122 does not cover the fresh air inlet 125, it does not reduce cooling efficiency of a cooling fan.

However, as for the case of business-use audio power amplifier, the depth dimension tends to increase with requirement specifications, such as improvement in extendibility, and correspondence to a digital network.

However, in each conventional example, when a body of power amplifier with long depth dimension is mounted on the rack of standard specification, there is a problem that the case is not settled in the rack of standard specification. Even if the case is settled in the rack of standard specification, there is a problem that there is no space for wiring input and output terminals provided in a rear panel of the case.

[Patent Document 1] Japanese Patent Application Laid-open No. H09-199879

[Non-patent Document 1] "POWERAMPLIFI-ERXP7000/XP5000/XP3500/XP2500/XP1000 Operation Manual", (online), YAMAHA CORP., (Searched June, 2007), the Internet (URL:http://www2.yamaha.co.jp/manual/pdf/pa/japan/amp/xp7000#ja.pdf), pages 6 and 15

[Non-patent Document 2] "POWER AMPLIFIER T5n/T4n/T3n Operation Manual", (online), YAMAHA CORP., (Search for in June, 2007), the Internet (URL:http://www2.yamaha.co.jp/manual/pdf/pa/japan/amp/t5n#t4n#t3n#ja#om.pdf), pages 6/18 and 16/18

SUMMARY OF THE INVENTION

The present invention is created in order to solve a problem mentioned above, and aims at providing an electronic apparatus mountable on a rack, which can adjust back and forth positions of the rack, and offset the position of the electronic apparatus outward from the front when mounting the electronic apparatus on the rack, and can grasp a carry handle even if the electronic apparatus is mounted in the state where it is offset outward from the front.

The present invention provides an electronic apparatus mountable on a rack, comprising: a front panel; a pair of side boards extending rearward from the front panel in a depth direction, and being spaced apart from each other at left and right sides in a width direction perpendicular to the depth direction; a pair of carry handles spaced apart from each other at left and right and attached to a front face of the front panel; and a pair of rack angles attached to the pair of the side boards, respectively. The side board is formed with a screw hole. The rack angle is composed of a first mounting plate and a second mounting plate intersecting perpendicularly to the first mounting plate, the first mounting plate being formed with a through-hole facing the screw hole formed in the side board and being attached to the side board by means of a screw through the through-hole formed in the first mounting plate, the second mounting plate being formed with a through-hole and being attached to a support part of the rack by means of a screw through the through-hole formed in the second mounting plate. The front panel has a pair of extended parts which extend in the width direction oppositely from each other and which protrude outwardly from the left and right sides of the side boards, the extended part having a shape opening a front of the through-hole formed in the second mounting plate in a state where the first mounting plate is attached to the side board. The carry handle is attached to a front face of the extended part of the front panel by means of a screw inserted from a rear face of the extended part of the front panel.

Therefore, since a position of a depth direction at which the first mounting plate of the rack angle is attached to the side board can be designed freely, the distance by which the mounting position shifts from the front can be adjusted when mounting the electronic apparatus on the rack.

The carry handle can be attached or can be removed without opening a case of the electronic apparatus, and the carry handle can be held also in a state where a mounting position of the electronic apparatus is offset from the front.

Since the front panel is formed in shape which escapes a front of the through-hole formed in the second mounting plate, operations which insert a driver (tool) from the front direction of this through-hole and secure a screw to the support part of the rack through this through-hole become easy.

Since the carry handle does not cover a fresh air inlet provided in the front panel where the fresh air inlet is formed in the front panel adjacent to the right and left side boards, and a fan for air cooling is provided in the front panel adjoining of the right and left side boards and facing the fresh air inlet, cooling efficiency of the fan for air cooling is not reduced. Furthermore, in case that an operating piece is provided in the front panel adjoining of the right and left side board, the carry handle does not become an obstacle to the operation of the operating piece since the carry handle does not cover the operating piece.

Preferably, the present invention provides the electronic apparatus, mountable in either of a standard mount state in the rack, or an offset mount state which offsets forward from the standard mount state in the depth direction of the rack. One of the through-hole formed in the first mounting plate of the rack angle and the screw hole formed in the side board is positioned in correspondence to both of the standard mount state and the offset mount state, so that the rack angle is selectively attached to the side board in ether of the standard mount state and the offset mount state. The second mounting plate of the rack angle is attached to and superposed on the extended part of the front panel in the standard mount state, and otherwise the second mounting plate is spaced rearward in the depth direction apart from the extended part of the front panel in the offset mount state.

Therefore, when the depth of the rack is large enough for depth of the electronic apparatus case, the electronic apparatus can be mounted on the rack in the standard mount state if one of the through-hole formed in the first mounting plate and the screw hole formed in the side board (for example, the screw hole formed in the side board) in a position corresponding to the standard mount state, and the other of the through-hole formed in the first mounting plate and the screw hole formed in the side board (for example, the through-hole formed in the first mounting plate) are made to face and attach with each other by means of a screw.

Furthermore, when the depth of the rack is insufficient or does not have enough space for the depth of the electronic apparatus case, the electronic apparatus can be mounted on the rack in the offset mount state if one of the through-hole formed in the first mounting plate and the screw hole formed in the side board (for example, the screw hole formed in the side board) formed in a position corresponding to the offset mount state, and the other through-hole formed in the first mounting plate and the screw hole formed in the side board (for example, the through-hole formed in the first mounting plate) are made to face and attach with each other by means of a screw.

It is possible to set length a front offset length shifted in the depth direction to two or more values, in the offset mount state mentioned above. In addition to the standard mount state, one of the through-holes formed in the first mounting plate and the screw hole formed in the side board may be formed in a position according to each of two or more values of he length shifted in the front direction.

Further preferably in the electronic apparatus mountable on the rack, the side board is formed with a folded part which is folded from a front end of the side board and which extends in the width direction outwardly from the side board, so that the folded part is placed between the extended part of the front panel and the second mounting plate in the standard mount state. The carry handle is attached to the front face of the extended part of the front panel by means of the screw inserted from a rear face of the folded part of the side board.

Therefore, since the front panel and the side board are mutually fastened in connection with attaching the carry handle with a screw, the rigidity of the rack attaching part of the case of the electronic apparatus increases.

Preferably in the electronic apparatus mountable on the rack, the rack angle has a symmetric shape with respect to a plane parallel to the depth direction and the width direction so that one rack angle is attached to one of the pair of the side boards and another rack angle having the same shape as the one rack angle is attached to the other of the pair of the side boards by changing a posture of the rack angle up side down. The rack angle has an escaping portion which is provided to avoid interference with the side board when the rack angle is attached to the side board and has a corresponding portion which is symmetric to the escaping portion relative to the plane. The rack angle has the through-holes which are arranged symmetric with respect to the plane and which are formed in the first and second mounting plates of the rack angle.

Therefore, since the rack angle attached to the side board of left-hand side and the rack angle attached to the side board of right-hand side constitute a common part, the manufacturing cost is reduced and parts management becomes easy.

According to the present invention, when mounting the electronic apparatus on the rack, there is an effect in which the depth of accommodation space can be freely designed by adjusting the depth position of the rack angle and offsetting the electronic apparatus forward in the direction of the rack (namely in the front direction). As a result, also when the electronic apparatus with long depth is mounted on the rack of standard specification, the electronic apparatus can be accommodated in the rack after ensuring a space in which wiring to input and output terminals is accommodated.

While a carry handle is easily attached and removed by a user, there is an effect in which the carry handle can be held, irrespective of the mount state of the electronic apparatus.

There is an effect in which operations which attach a screw to the support part of the rack through the through-hole formed in the second mounting plate are easy.

BRIEF DESCRIPTION OF THE DRAWINGS

FIGS. 6(a), 6(b) and 6(c) are an explanatory diagram showing a first conventional example of business-use audio power amplifier.

FIG. 7 is an explanatory diagram showing a second conventional example of business-use audio power amplifier.

DETAILED DESCRIPTION OF THE INVENTION

Figure 1:
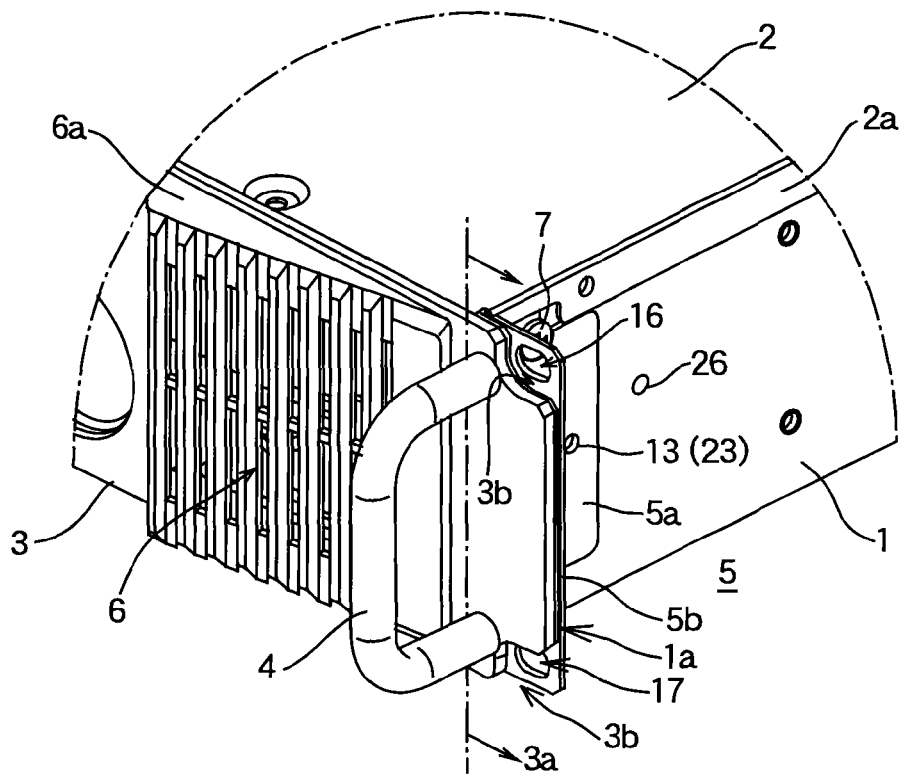
FIGS. 1(a) and 1(b) are an outline view of an important section showing an embodiment of the present invention.
Figure 1:
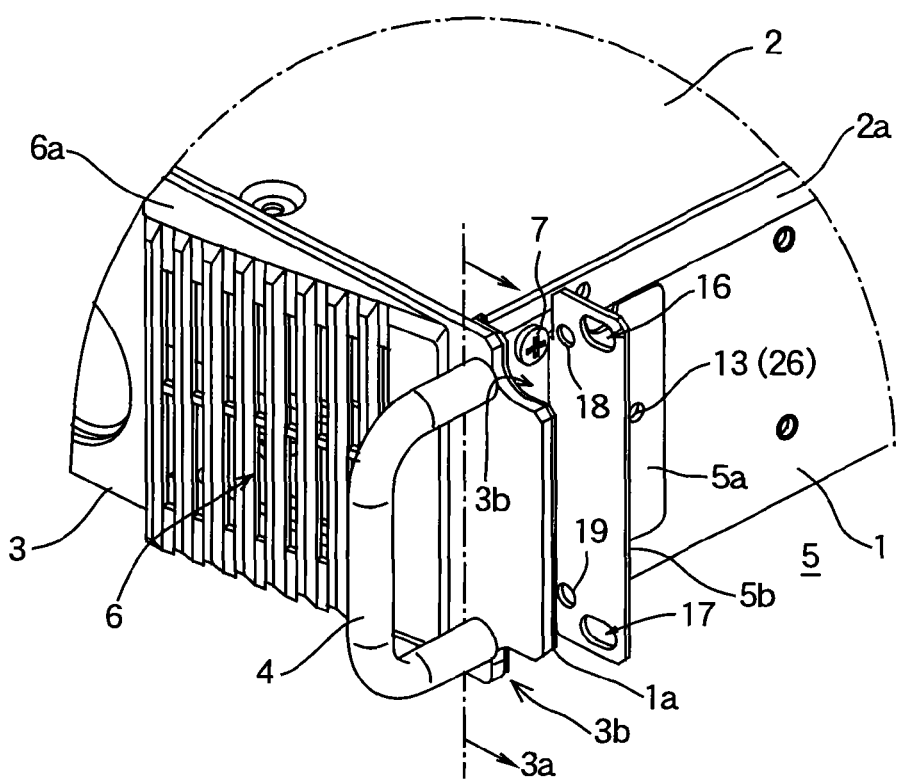
Figure 2:
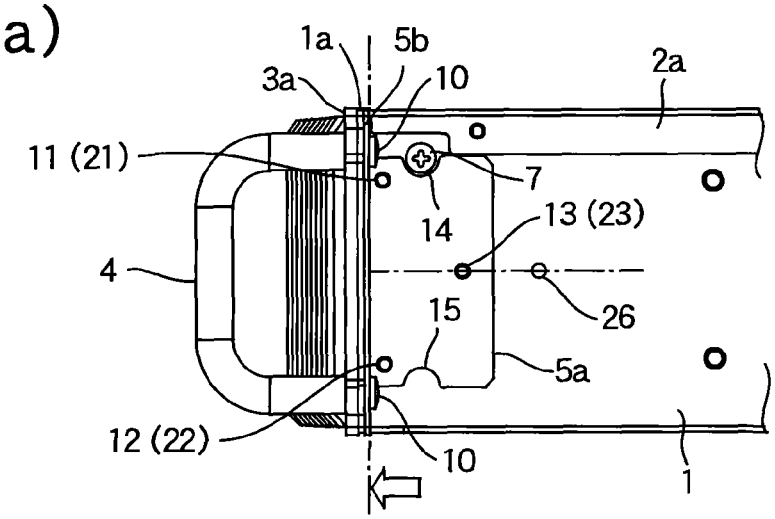
FIGS. 2(a) and 2(b) are a right side view of an important section showing an embodiment of the present invention.
Figure 2:
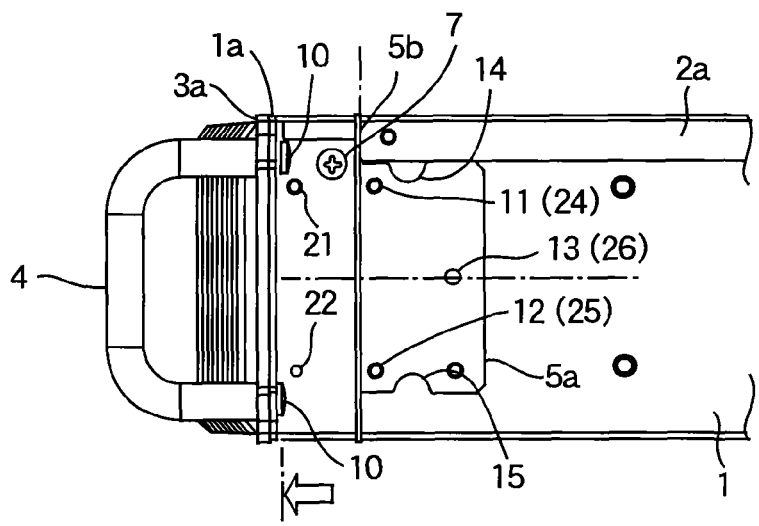

FIG. 1 is an outline view of an important section showing an embodiment of the present invention. In addition, the whole outline view is shown in FIG. 5(a). FIG. 2 is a right side view of an important section showing the embodiment of the present invention.

FIG. 1(a) and FIG. 2(a) show a standard mount state, and FIG. 1(b) and FIG. 2(b) show an offset mount state. In the figures, a horizontal dot and dash line indicates a symmetric axis of the rack angle, and a vertical dot and dash line indicates an attaching face to a rack.

Figure 3:
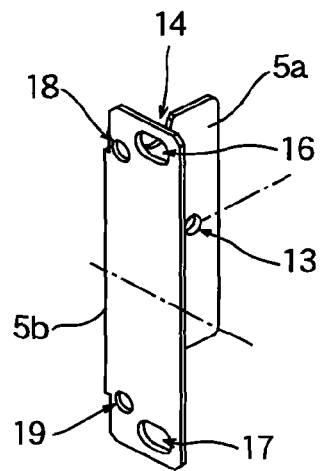
FIG. 3(a) is an outline view of a rack angle shown in FIG. 1 and FIG. 2.
FIG. 3(b) is an outline view showing a modified example of the rack angle.
Figure 3:
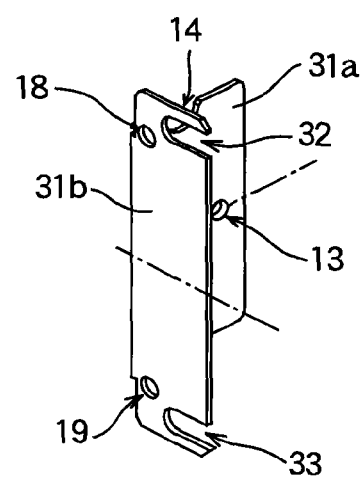

FIG. 3 is an outline view of a rack angle. FIG. 3(a) is an outline view of a rack angle shown in FIG. 1 and FIG. 2, and FIG. 3(b) is an outline view showing a modified example of the rack angle. In the figures, a dot and dash line indicates a symmetric plane.

In the figure, the reference numeral 1 denotes a side board of a main chassis. In an illustrated example, the folded part 1a of the main chassis side board is formed by bending this side board 1 from a front direction to a width direction.

The reference numeral 2 denotes a top cover. The folded part 2a of the top cover is formed by bending a part of this top cover 2 which abuts to upper limit of the right and left side boards 1 to the lower side.

The reference numeral 3 denotes a front panel (front surface board). The reference numeral 4 denotes a carry handle, the reference numeral 5 denotes a rack angle, the reference numeral 6 denotes a fresh air inlet, the reference numeral 6a denotes a front filter grill, and the reference numeral 7 denotes a screw. This screw 7 is for attaching the side board 1 of the main chassis to a sub chassis 91 shown in FIG. 5(b). A through-hole is formed in the side board 1 of the main chassis at a position of this screw 7 (it is one place to an upper portion of the right and left side board). Illustration is omitted about other screws.

Although the main chassis is formed integrally with the illustrated side board 1, a sole plate which is not illustrated and a back plate 81 (refer to FIG. 5(b)). However, each may be formed as a different body. A case of the audio power amplifier comprises the main chassis, the top cover 2, and a sub chassis 91 (refer to FIG. 5(b)). The front panel 3 has an extended part 3a which extends outward of the side board (right and left side board) 1 in the width direction of the main chassis, and is placed at the front of the right and left side board.

This extended part 3a is formed in shape which escapes a front direction of the through-holes (long hole) 16 and 17 formed in a second mounting plate 5b in a state where a first mounting plate 5a of the rack angle 5 is attached to the side board 1 of the main chassis with a screw. This is because the extended part 3a interferes with a screw for attachment, when attaching the rack angle 5 to the support part of the rack with a screw. In the illustrated example, a notched part 3b is formed in four corners of the extended part 3a, respectively. This notched part 3b is the shape of an approximately square in correspondence with the through-holes (long hole) 16 and 17.

A horizontal part of the carry handle 4 of a right and left pair at those upper and lower sides is attached dismountably with the screw 10 (refer to FIG. 2) from the back side of this extended part 3a on both sides of the extended part 3a of the front panel.

The rack angle 5 is a part of L shape, and is formed so that the first mounting plate 5a and the second mounting plate 5b may intersect perpendicularly, as shown in FIG. 3(a). In the illustrated example, the three through-holes 11 to 13 and the two notched parts 14 and 15 of semicircle shape are formed in a direction of the first mounting plate 5a as shown in FIG. 2(a) and FIG. 2(b). Height of the front panel 3 is approximately the same as a longitudinal dimension of the second mounting plate 5b.

As shown in FIG. 2(a) and FIG. 2(b), two groups (21, 22, 23), (24, 25, 26) of the three screw holes (hole by which the screw cutter is performed) are formed at the side board 1 of the main chassis, so that the three through-holes 11, 12, and 13 may be faced. The group of the three screw holes 21, 22, and 23 is formed in a position corresponding to the standard mount state. On the other hand, the group of the three screw holes 24, 25, and 26 is formed in a position corresponding to the offset mount state.

A diameter of the notched part 14 of semicircle shape is larger slightly than a diameter of the head of the screw 7. In the standard mount state, the notched part 14 of this semicircle shape is formed, in order that the rack angle 5 escapes a position of the screw 7 and is attached to the side board 1 of the main chassis. Therefore, when changing a mount state of the rack angle 5, the rack angle 5 can be moved without removing the screw 7. The screw 7 fastens the sub chassis 91 shown in FIG. 5(b) and the side board 1 of the main chassis, as explained previously.

On the other hand, as best shown in FIG. 3(a), the two through-holes (long hole) 16 and 17 and the two through-holes 18 and 19 are formed in a direction of the second mounting plate 5b.

Although one pair is used for right and left, the rack angle 5 is designed so that the pair attached to the respective side boards 1 of the main chassis may have an identical shape. The illustrated rack angle 5 is shown in the state where it is attached to the side board on a right-hand side. This rack angle 5 is formed with a plane of symmetry which is shown as a nodal line in FIG. 2 and FIG. 3 and which is the up-and-down center so that the rack angle may become plane symmetry (symmetrical with a mirror) up and down, so that the same rack angle 5 can attach also to the side board on a left-hand side.

If half rotation of the upper and lower sides of the rack angle 5 in the illustrated mount state is performed, the rotated rack angle will be in a state which can be attached with the side board on the left-hand side of the main chassis.

Therefore, the length from intersection with a plane of symmetry of the rack angle 5 (axis of symmetry of the first mounting plate 5a) to upper limit of the first mounting plate 5a is not only made shorter than the second mounting plate 5b so that the folded part 2a of the top cover acting as an obstacle may be escaped when attaching the rack angle 5 to the side board 1 on the right-hand side of the main chassis, but the length from intersection with a plane of symmetry of the rack angle 5 (axis of symmetry of the first mounting plate 5a) to a lower limit is also shortened symmetrically so that the folded part 2a of the top cover is escaped when the rack angle 5 is attached to the side board on the left-hand side.

Furthermore, the through-holes 11, 12, and 13, the notched parts 14 and 15 of semicircle shape, the through-holes (long hole) 16 and 17, and the through-holes 18 and 19 are also positioned plane symmetry up and down with respect to the plane of symmetry shown in FIG. 2 and FIG. 3 (the through-hole 13 is formed on a plane of symmetry).

At this point, although the notched part 15 of semicircle shape is unnecessary in the mount state to the side board 1 on the right-hand side of the main chassis, the notched part 15 of semicircle shape is required in order to escape a screw provided in same position for the same purpose as the screw 7, when the rack angle 5 is attached to the side board on the left-hand side.

In addition, although it does not exist in the illustrated example, and it is unnecessary to attachment to the side board on one side, a through-hole which is needed for attachment to the side board on another side may be formed.

For example, in the conventional rack angle 115 shown in FIG. 6(b), the two through-holes (escape hole in the illustrated example) $120_3$ and $120_5$ used only when attaching the rack angle 115 to the side board on one side are formed.

In the standard mount state shown in FIG. 1(a) and FIG. 2(a), if a position of the group of the screw holes 21, 22, and 23 among two groups of two or more screw holes and a position of the through-holes 11, 12, and 13 are registered with each other and are secured with three screws which are not illustrated, the first mounting plate 5a of the rack angle 5 will be attached to the side board 1 of the main chassis. At this time, the second mounting plate 5b of the rack angle 5 sandwiches the folded part 1a of the main chassis side board with the extended part 3a of the front panel in overlapping manner.

The side board 1 of right and left of the main chassis is attached to the support part of the rack by registering the rear surface of the second mounting plate 5b of the rack angle 5 with the support part of the rack which does not illustrate, inserting a head of a driver (tool) from the notch 3b of the front panel 3, passing a screw through the through-holes (long hole) 16 and 17 formed in the second mounting plate 5b of the rack angle 5, and securing to the support part of the rack with the screw.

As a result, the front panel 3 is mounted on the rack so that the front panel 3 may be located slightly protruded in a front direction from the front of the support part of the rack by a thickness which is a sum of the thickness of the folded part 1a of the main chassis side board and the thickness of the second mounting plate 5a of the rack angle.

When the folded part 1a of the main chassis side board is provided, the carry handle 4 is attached to the extended part 3a of the front panel while sandwiching the extended part 3a of the front panel, the folded part 1a of the main chassis side board, and the second mounting plate 5b of the rack angle 5, by means of the screw 10 inserted from the back side. The through-holes 18 and 19 shown in FIG. 3(a) are provided for passing through the screw 10, at this time. In this case, the extended part 3a of the front panel is fastened together with the folded part 1a of the main chassis side board and the second mounting plate 5b, and then the rigidity of a part which attaches the rack increases. However, when re-attaching to an offset position shown in FIG. 2(b) explained below, it is necessary to once remove the screw 10.

On the other hand, if a diameter of the through-holes 18 and 19 is made into a larger escape hole than a diameter of the screw head, the carry handle 4 will not fasten together with the rack angle 5. In this case, without removing the screw 10, the rack angle 5 can be removed from the side board 1 of the main chassis, and the rack angle 5 can re-fix to the offset position shown in FIG. 2(b) explained below.

As shown in FIG. 1(b) and FIG. 2(b), in the offset mount state (mount state where the audio power amplifier is pulled out at near side), the first mounting plate 5a of the rack angle 5 is attached to the side board 1 of the main chassis by registering a position of a group of the screw holes 24, 25, and 26 of two groups of screw holes and a position of the through-holes 11, 12, and 13 with each other, and attaching them with three screws which are not illustrated. At this time, the second mounting plate 5b of the rack angle 5 offsets rearward in the depth direction rather than the extended part 3a of the front panel 3.

Also at this time, the power amplifier is mounted on the rack by registering the rear surface of the second mounting plate 5b of the rack angle 5 with a support part of the rack which does not illustrate, and by inserting a head of a driver (tool) from the notch 3b of the front panel 3, and passing a screw through to the through-holes (long hole) 16 and 17, and attaching to the support part of the rack which is not illustrated.

As a result, the power amplifier is mounted on the rack in the offset mount state where the front panel 3 comes out forward as compared with the standard mount state by the length which shifts the rack angle 5 to the depth direction as compared with the standard mount state shown in FIG. 1(a) and FIG. 2(a).

In the example of illustration, two groups of screw holes are provided in the side board 1 of the main chassis according to the two mount states.

Replacing with this, one group of screw holes may be provided in the side board 1 of a main chassis, and two groups of through-holes may be provided in the rack angle 5 according to two mount states. What is necessary is to adjust and attach one group of screw holes to a through-hole of one of groups among two groups of through-holes with a screw. However, since it is necessary to make the first mounting plate long to the depth direction in order to provide two or more groups of through-holes in the rack angle 5, an additional material cost will be applied.

Furthermore, both of the number of groups of the screw holes and the through-holes are made into two or more, and combination of a group of the screw holes and a group of a through-holes can increase a front offset length shifted to a front direction to two or more steps according to more combinations.

A pair of the fresh air inlet 6 is formed in the front panel 3 adjoining of the side board 1 of right and left of the main chassis, and the fresh air inlet 6 is protected by the front filter grill 6*a*. The illustrated audio power amplifier is adjoining of the side board 1 of right and left of the main chassis, faces the fresh air inlet 6, and contains one pair of the fans 92 and 93 for air cooling (refer to FIG. 5(*b*)).

Since the carry handle 4 is positioned separately from the front of the fresh air inlet 6, the carry handle does not reduce cooling efficiency of the fans 92 and 93 for cooling. Furthermore, the carry handle 4 is not attached to the rack angle 5. Therefore, even when the rack angle 5 is moved to a depth direction and is attached to the side board 1 of a main chassis, it is not hard to hold the carry handle 4 because the carry handle 4 does not retract.

In the rack angle 5 shown in FIG. 3(*a*), in order to attach to the support part of the rack with a screw, the through-holes (long hole) 16 and 17 are used. Replacing with this, the through-holes 32 and 33 which have a notch may be used like the rack angle 31 of the modified example shown in FIG. 3(*b*).

Figure 4:
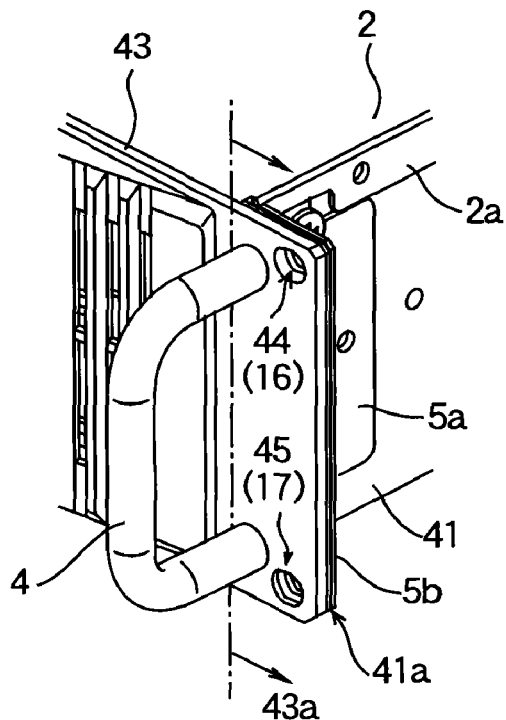
FIGS. 4(a), 4(b) and 4(c) are an explanatory diagram showing modified examples about an extended part of the front panel in an embodiment of the present invention.
Figure 4:
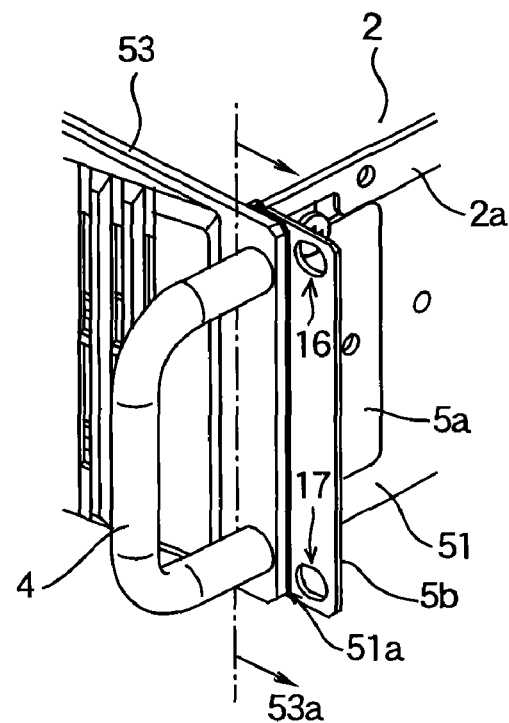
Figure 4:
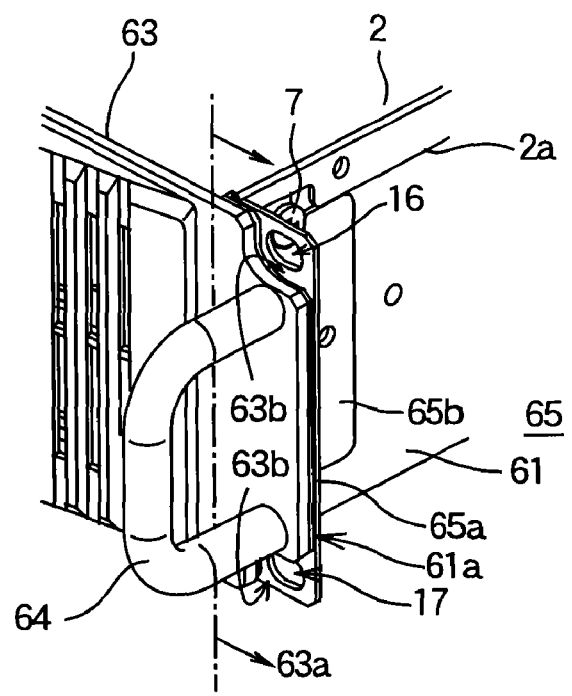

FIG. 4 is an explanatory diagram showing a modified example of an extended part of the front panel in an embodiment of the present invention. All show the case of the standard mount state.

In FIG. 4, the same reference numerals are given to the same parts as FIG. 1 to FIG. 3.

In a first modified example shown in FIG. 4(*a*), the reference numeral 41 denotes a side board of a main chassis, the reference numeral 41*a* denotes a folded part of the main chassis side board, the reference numeral 43 denotes a front panel, and the reference numeral 43*a* denotes an extended part. A top cover 2, a carry handle 4, and a rack angle 5 are the same as FIG. 1 to FIG. 3.

There is no notched part in the four corners in the extended part 43*a* of the front panel. Replacing with a notched part, the through-holes (long hole) 44 and 45 are formed in a position that registers with the through-holes (long hole) 16 and 17 formed in the second mounting plate 5*b* of the rack angle 5 shown in FIG. 3(*a*). The through-holes 44 and 45 are formed in the extended part 43*a* of the front panel in alignment with an axis of a depth direction passing the through-holes 16 and 17. As a result, the extended part 43*a* of this front panel also has the shape which escapes a front direction of the through-holes (long hole) 16 and 17. The carry handle 4 is attached with the screw 10 from the back side like FIG. 1 to FIG. 3 on both sides of the extended part 43*a* of the front panel and the folded part 41*a* of the main chassis side board.

In the illustrated standard mount state, the second mounting plate of the rack angle can be attached to a support part of the rack which is not illustrated with a screw by passing the screw through to the through-hole (long hole) 44 (16) and the through-hole 45 (17).

On the other hand, in the offset mount state, what is necessary is to insert a head of a driver (tool) in the through-holes (long hole) 44 and 45, and to secure a screw to the support part of the rack through the through-holes (long hole) 16 and 17 formed in the second mounting plate 5*b* of the rack angle 5. However, workability becomes a little worse.

The through-holes 44 and 45 may be larger escape holes than a diameter of the screw head. In this case, in the standard mount state, the screw is not fastened together with the extended part 43*a* of the front panel.

When the folded part 41*a* of the main chassis side board is provided, the same through-hole as the through-holes 44 and 45 is provided while registering this shape with shape of the extended part 43*a* of the front panel.

In a second modified example shown in FIG. 4(*b*), the reference numeral 51 denotes a side board of a main chassis, the reference numeral 51*a* denotes a folded part of the main chassis side board, the reference numeral 53 denotes the front panel, and the reference numeral 53*a* denotes the extended part. A top cover 2, a carry handle 4, and a rack angle 5 are the same as FIG. 1 to FIG. 3.

The extended part 53*a* of the front panel has the shape which clears a front of the through-holes (long hole) 16 and 17 by making its right and left edge side shorter than a right and left edge side of the second mounting plate 5*b* of the rack angle 5 shown in FIG. 3(*a*). As in FIG. 1 to FIG. 3, the carry handle 4 sandwiches at least the extended part 53*a* of the front panel and the folded part 51*a* of the main chassis side board with the screw 10 inserted from the back side.

A method of attaching the audio power amplifier to a support part of a rack which is not illustrated is the same as the embodiment shown in FIG. 1 to FIG. 3.

However, since there is little remaining thickness from a through-hole (equivalent to the through-holes 18 and 19 of the rack angle 5) for attaching the carry handle 4 formed in the extended part 53*a* of the front panel to a right and left edge side, the mounting strength of the carry handle 4 is disadvantageous.

Furthermore, in the illustrated example, the width of the through-holes (long hole) 16 and 17 formed in the second mounting plate 5*b* of the rack angle 5 is little shorter than the width of the through-holes (long hole) 16 and 17 shown in FIG. 2(*a*). This is because there is no margin in lateral space of the through-holes (long hole) 16 and 17 and the through-holes 18 and 19, in the illustrated example.

In addition, the shape of the folded part 51*a* is adjusted with the shape of the extended part 53*a* of the front panel when the folded part 51*a* of the main chassis side board is provided.

In a third modified example shown in FIG. 4(*c*), the reference numeral 61 denotes a side board of a main chassis, the reference numeral 61*a* denotes a folded part of the main chassis side board, the reference numeral 63 denotes a front panel, the reference numeral 63*a* denotes an extended part, the reference numeral 64 denotes a carry handle, the reference numeral 65 denotes a rack angle, the reference numeral 65*a* denotes a first mounting plate, and the reference numeral 65*b* denotes a second mounting plate. A top cover 2 is the same as FIG. 1 to FIG. 3.

About the outline shape of the front panel 63, it is the same as the front panel 3 shown in FIG. 1 to FIG. 3, and the notched part 63*b* is formed in the extended part 63*a* at four corners.

The carry handle 64 is provided between the through-holes (long hole) 16 and 17 which attach the rack angle 65. Therefore, a through-hole for passing through a screw for attaching the carry handle 64, in addition to the rack angle 5 shown in FIG. 3(a), is formed in the second mounting plate 65b of the rack angle 65.

The carry handle 64 is attached from the back side by a screw through layers of the extended part 63a of the front panel, the folded part 61a of the side of the main chassis, and the rack angle 65. However, since longitudinal dimension of the carry handle 64 becomes short and a part which receives a hand becomes narrow, workability at the time of carrying the audio power amplifier is inferior.

In this third modified example, there is a problem that a head of the screw 10 abuts against the support part of the rack, in the standard mount state. Therefore, the head of the screw 10 can be prevented from abutting against the support part of the rack, for example, by making the additional through-hole formed in the second mounting plate 65b of the rack angle 65 mentioned above into a larger escape hole than a diameter of the screw head, and by using a through-hole provided in the folded part 41a of the main chassis side board and the extended part 63a of the front panel as a spot facing hole which accommodates the screw head (flat countersunk head screw).

In addition, also in the examples of FIG. 1 to FIG. 3, FIG. 4(a), and FIG. 4(b), when the head of the screw for attaching the carry handle 4 abuts to the support part of the rack, what is necessary is to use the screw as a flat countersunk head screw, to use the through-hole formed in the second mounting part of the rack angle as an escape hole, and to use the through-hole formed in the extended part of the front panel as a spot facing hole, as well as the case of FIG. 4(c).

Figure 5:
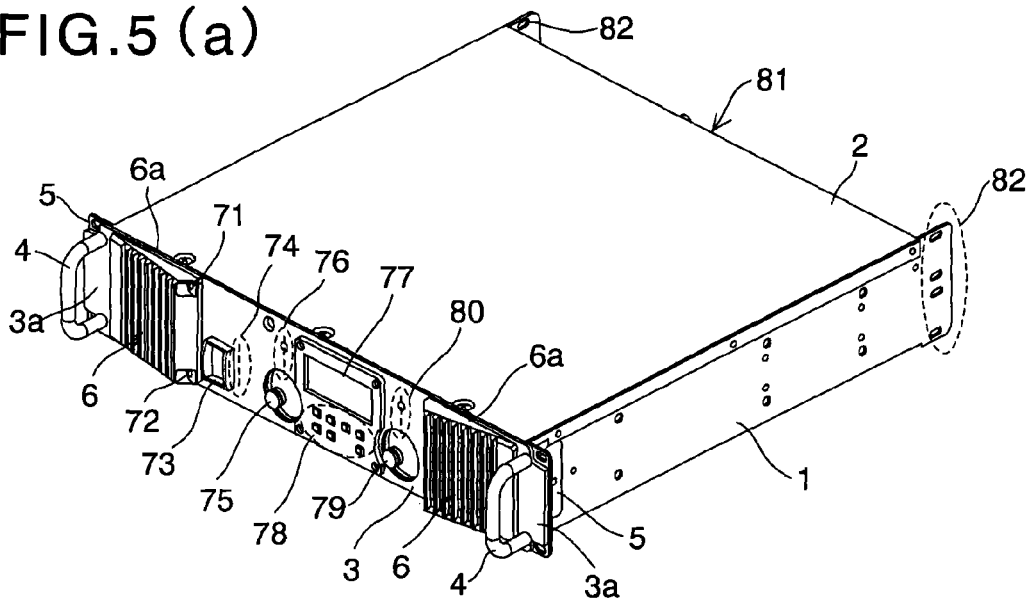
FIGS. 5(a) and 5(b) are a general view in a standard mount state of an embodiment of the present invention.
Figure 5:
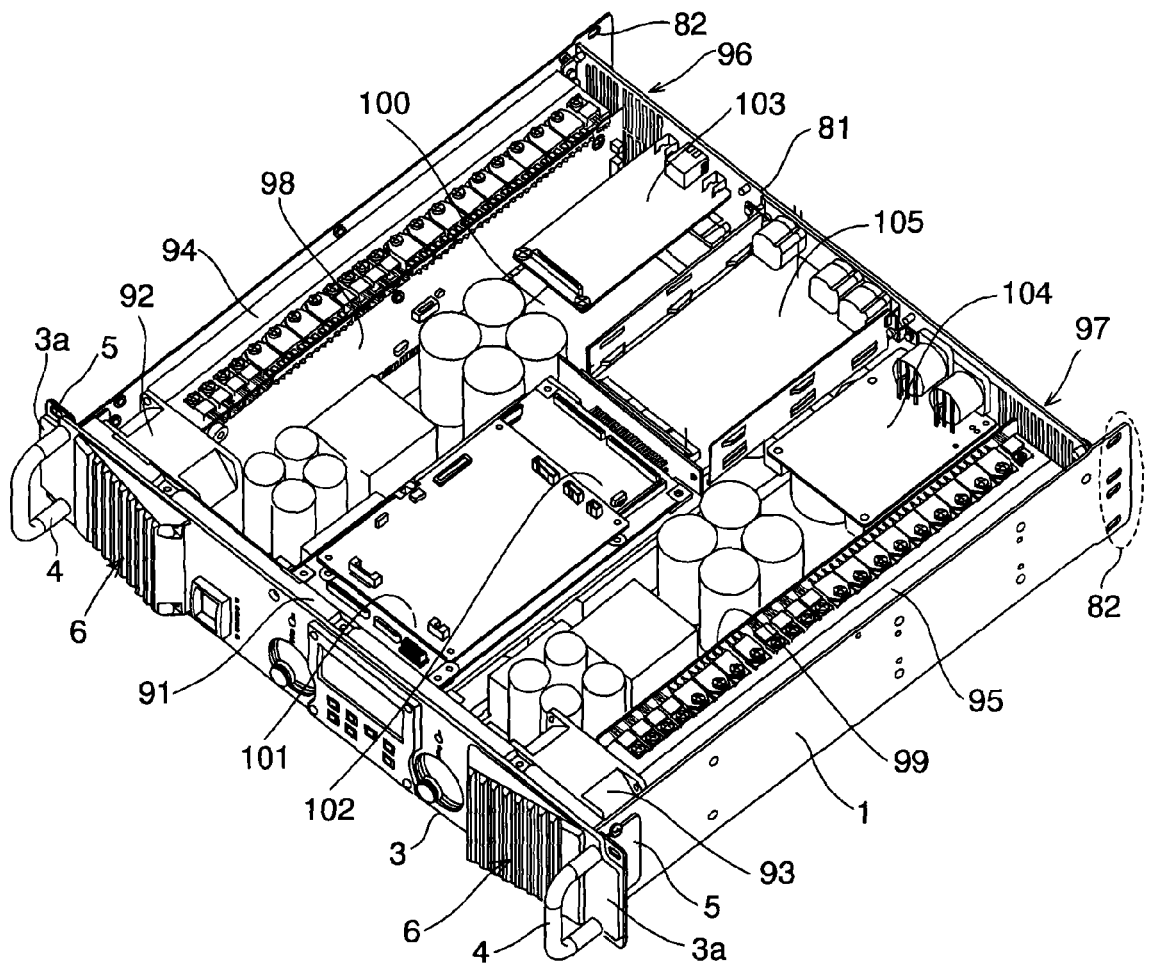

FIG. 5 is a general view in the standard mount state of the embodiment of the present invention. FIG. 5(a) is a whole outline view, and FIG. 5(b) is an outline view showing an internal structure.

In FIG. 5, the same reference numerals are given to the same parts as FIG. 1 to FIG. 3.

In FIG. 5(a), it explains supplementary parts which did not appear in FIG. 1 to FIG. 3.

The reference numerals 71 and 72 are through-holes formed in the front filter grill 6a, and the front filter grill 6a is attached to the front panel 3 through a screw at this point.

The reference numeral 73 denotes an electric power switch, the reference numeral 74 denotes a first indicator (light emitting diode) group, the reference numeral 75 denotes a sound volume of A system, the reference numeral 76 denotes a second indicator (light emitting diode) group, the reference numeral 77 denotes a panel indicator, the reference numeral 78 denotes a control group, the reference numeral 79 denotes a sound volume of B system, and the reference numeral 80 denotes a third indicator (light emitting diode) group. A knob of the sound volumes 75 and 79 of A system and B system has not been attached yet.

The reference numeral 81 denotes a back plate of the main chassis. As for the top cover 2, its rear end part is bent, and attached to the back plate 81 with a screw. The reference numerals 82 denote two or more through-holes (long hole) provided in a projection part of the side board 1 of the main chassis projecting rearward from the back plate 81. The projecting part can attach also to a support part which is behind the rack through a screw at two or more through-holes (long hole) 82 in order to fix the audio power amplifier to the rack strongly.

An internal structure of the power amplifier will be explained with reference to FIG. 5(b). Two or more electrical parts by which unitization is performed are built in an inside of the main chassis.

The reference numeral 91 denotes a sub chassis. The sub chassis 91 is attached to a front part of the main chassis, and fixes a substrate for indicators of panel indicator 77 etc., a substrate for controls of group 78 etc., and the fans 92 and 93 for cooling.

Behind the fans 92 and 93 for cooling, the heat sinks 94 and 95 providing two or more fins is built along with the side board 1 of right and left of the main chassis to the back plate 81, and is fixed on the side board 1 of right and left of the main chassis. The exhaust outlets 96 and 97 are provided in the back plate 81.

The power amplifier circuit substrates 98 and 99 are provided in an internal surface of the heat sinks 94 and 95, and an output transistor, a transistor for current supply, a temperature detection sensor, etc. are fixed on the upper surface of the heat sinks 94 and 95.

Between the power amplifier circuit substrates 98 and 99, the power circuit substrate 100 is installed at the sole plate side of the main chassis. Power source supply circuits of A and B systems are distributed on the power circuit substrate 100. The CPU substrate 101, the DSP substrate 102, and the input/output terminals substrates 103, 104, and 105 are provided in the upper part of the power circuit substrate 100. Among them, the input output terminals substrate 105 is an extension substrate attached as an option.

The CPU substrate 101 performs control of an operation system and a display system. The DSP substrate 102 also protects an output transistor of the power amplifier circuit substrate 98 by detecting overheating of the heat sink 94 and abnormalities of output voltage and output current, and intercepting an audio input signal supplied to the power amplifier circuit substrate 98 at this time.

The rack angles 5, 31, and 65 are used as parts of L shape formed so that the first mounting plate and second mounting plate are connected with each other in rectangular combination directly, in the explanation mentioned above. However, the rack angles 5, 31, and 65 may be formed so that the first mounting plate as an attaching part by which the fixing is performed to the right and left side board, and the second mounting plate as an attaching part by which the abutting to the rack support part and the fixing is performed through a screw may intersect perpendicularly.

For example, the first mounting plate and second mounting plate may be the parts formed so that they might join together through a planate coupling region (for example, plate which achieves an angle of 45 degrees for both) or a curved surface shape coupling region.

In the explanation mentioned above, although the present invention is explained about the audio power amplifier for rack mounting, it is applicable to the general electronic apparatus for rack mounting. In particular, the present invention is suitable for an electronic apparatus in which a fresh air inlet or an exhaust outlet is formed adjoining of a right and left side board, and a fan for air cooling is provided adjoining of a right and left side board and facing a fresh air inlet or an exhaust outlet, in the front panel. Or, the present invention is suitable for an electronic apparatus in which the manual controls are provided in the front panel adjoining of the right and left side board.

The invention claimed is:

1. An electronic apparatus mountable on a rack, comprising:
   a front panel;
   a pair of side boards extending rearward from the front panel in a depth direction, and being spaced apart from each other at left and right sides in a width direction perpendicular to the depth direction;
   a pair of carry handles spaced apart from each other at left and right and attached to a front face of the front panel; and
   a pair of rack angles attached to the pair of the side boards, respectively,
   wherein the side board is formed with a screw hole,
   wherein the rack angle is composed of a first mounting plate and a second mounting plate intersecting perpendicularly to the first mounting plate, the first mounting plate being formed with a through-hole facing the screw hole formed in the side board and being attached to the side board by means of a screw through the through-hole formed in the first mounting plate, the second mounting plate being formed with a through-hole and being attached to a support part of the rack by means of a screw through the through-hole formed in the second mounting plate,
   wherein the front panel has a pair of extended parts which extend in the width direction oppositely from each other and which protrude outwardly from the left and right sides of the side boards, the extended part having a shape escaping a front of the through-hole formed in the second mounting plate in a state where the first mounting plate is attached to the side board, and
   wherein the carry handle is attached to a front face of the extended part of the front panel by means of a screw inserted from a rear face of the extended part of the front panel.

2. The electronic apparatus according to claim 1, mountable in either of a standard mount state in the rack, or an offset mount state which offsets forward from the standard mount state in the depth direction of the rack,
   wherein one of the through-hole formed in the first mounting plate of the rack angle and the screw hole formed in the side board is positioned in correspondence to both of the standard mount state and the offset mount state, so that the rack angle is selectively attached to the side board in ether of the standard mount state and the offset mount state, and
   wherein the second mounting plate of the rack angle is attached to and superposed on the extended part of the front panel in the standard mount state, and otherwise the second mounting plate is spaced rearward in the depth direction apart from the extended part of the front panel in the offset mount state.

3. The electronic apparatus according to claim 2,
   wherein the side board is formed with a folded part which is folded from a front end of the side board and which extends in the width direction outwardly from the side board, so that the folded part is placed between the extended part of the front panel and the second mounting plate in the standard mount state, and
   wherein the carry handle is attached to the front face of the extended part of the front panel by means of the screw inserted from a rear face of the folded part of the side board.

4. The electronic apparatus according to claim 1,
   wherein the rack angle has a symmetric shape with respect to a plane parallel to the depth direction and the width direction so that one rack angle is attached to one of the pair of the side boards and another rack angle having the same shape as the one rack angle is attached to the other of the pair of the side boards by changing a posture of the rack angle up side down,
   wherein the rack angle has an escaping portion which is provided to avoid interference with the side board when the rack angle is attached to the side board and has a corresponding portion which is symmetric to the escaping portion relative to the plane, and
   wherein the rack angle has the through-holes which are arranged symmetric with respect to the plane and which are formed in the first and second mounting plates of the rack angle.

* * * * *